(12) United States Patent
Wildenberg et al.

(10) Patent No.: US 11,796,920 B2
(45) Date of Patent: Oct. 24, 2023

(54) METHOD FOR CONTROLLING A MANUFACTURING PROCESS AND ASSOCIATED APPARATUSES

(71) Applicant: ASML NETHERLANDS B.V., Veldhoven (NL)

(72) Inventors: Jochem Sebastiaan Wildenberg, Aarle-Rixtel (NL); Hermanus Adrianus Dillen, Veldhoven (NL); Fan Feng, Eindhoven (NL); Ronald Van Ittersum, Tilburg (NL); Willem Louis Van Mierlo, Helmond (NL); Koen Thuijs, Vught (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/797,506

(22) PCT Filed: Jan. 14, 2021

(86) PCT No.: PCT/EP2021/050615
§ 371 (c)(1),
(2) Date: Aug. 4, 2022

(87) PCT Pub. No.: WO2021/160365
PCT Pub. Date: Aug. 19, 2021

(65) Prior Publication Data
US 2023/0082858 A1     Mar. 16, 2023

(30) Foreign Application Priority Data

Feb. 12, 2020 (EP) .................................... 20156961
Feb. 20, 2020 (EP) .................................... 20158387
May 29, 2020 (EP) .................................... 20177353

(51) Int. Cl.
*G03F 7/20* (2006.01)
*G03F 7/00* (2006.01)

(52) U.S. Cl.
CPC ............................. *G03F 7/70525* (2013.01)

(58) Field of Classification Search
CPC .. G03F 7/705; G03F 7/70508; G03F 7/70525; G03F 7/70616; G03F 7/70625;
(Continued)

(56) References Cited

U.S. PATENT DOCUMENTS 7,670,731 B2 * 3/2010 Finders ............... G03F 7/70425
430/311
7,703,069 B1    4/2010 Liu et al.
(Continued)

FOREIGN PATENT DOCUMENTS

EP      3495888      6/2019
TW      201314375    4/2013
(Continued)

OTHER PUBLICATIONS

International Search Report and Written Opinion issued in corresponding PCT Patent Application No. PCT/EP2021/050615, dated May 27, 2021.

Primary Examiner — Deoram Persaud
(74) Attorney, Agent, or Firm — Pillsbury Winthrop Shaw Pittman, LLP

(57) ABSTRACT

A method and associated apparatuses for controlling a process of manufacturing semiconductor devices on a substrate. The method includes obtaining process data relating to the process and determining a correction for the process based on the process data and a first control objective associated with the devices on the substrate. A first probability of the first control objective being achievable is determined and the correction adjusted based on the probability
(Continued)

ability and at least a second control objective having a second probability of being achievable compared to the first control objective.

20 Claims, 5 Drawing Sheets

(58) Field of Classification Search
CPC ............. G03F 7/70633; G03F 7/70641; G01C 21/3446; G01C 21/3453; G01C 21/3484; G06F 15/76; G06N 20/00; H01L 22/20; G05B 19/41885; G05B 2219/32015; G05B 2219/50129; Y02P 90/02
See application file for complete search history.

(56) References Cited

U.S. PATENT DOCUMENTS

| | | | |
|---|---|---|---|
| 7,791,727 | B2 | 9/2010 | Den Boef et al. |
| 7,791,732 | B2 | 9/2010 | Den Boef et al. |
| 7,921,383 | B1* | 4/2011 | Wei .................... G03F 7/705 |
| | | | 716/54 |
| 8,411,287 | B2 | 4/2013 | Smilde et al. |
| 8,705,007 | B2 | 4/2014 | Cramer et al. |
| 8,786,825 | B2 | 7/2014 | Van De Kerkhof et al. |
| 9,081,303 | B2 | 7/2015 | Cramer et al. |
| 9,134,256 | B2 | 9/2015 | Smilde et al. |
| 9,140,998 | B2 | 9/2015 | Smilde et al. |
| 9,261,772 | B2 | 2/2016 | Quintanilha |
| 10,802,408 | B2* | 10/2020 | Mos .................... G03F 7/705 |
| 11,079,687 | B2* | 8/2021 | Slachter ............. G03F 7/70641 |
| 2004/0093107 | A1* | 5/2004 | Good ..................... H01L 22/20 |
| | | | 257/E21.525 |
| 2006/0033921 | A1 | 2/2006 | Den Boef et al. |
| 2006/0066855 | A1 | 3/2006 | Den Boef et al. |
| 2010/0201963 | A1 | 8/2010 | Cramer et al. |
| 2011/0027704 | A1 | 2/2011 | Cramer et al. |
| 2011/0043791 | A1 | 2/2011 | Smilde et al. |
| 2011/0102753 | A1 | 5/2011 | Van De Kerkhof et al. |
| 2012/0044470 | A1 | 2/2012 | Smilde et al. |
| 2012/0123581 | A1 | 5/2012 | Smilde et al. |
| 2012/0278768 | A1 | 11/2012 | Yang et al. |
| 2013/0258310 | A1 | 10/2013 | Smilde et al. |
| 2013/0271740 | A1 | 10/2013 | Quintanilha |
| 2014/0282307 | A1* | 9/2014 | Latypov ................. G06F 30/39 |
| | | | 716/56 |
| 2016/0162626 | A1* | 6/2016 | Herrmann ........... G03F 7/70641 |
| | | | 716/51 |
| 2016/0246168 | A1* | 8/2016 | Ye .............................. G03F 1/36 |
| 2020/0278614 | A1* | 9/2020 | Werkman ............ G03F 7/70616 |
| 2021/0080838 | A1* | 3/2021 | Tel ....................... G03F 7/70616 |
| 2021/0397172 | A1* | 12/2021 | Slachter ............. G05B 19/4188 |
| 2022/0011728 | A1* | 1/2022 | Zhang ..................... G06F 30/27 |
| 2022/0252988 | A1* | 8/2022 | Werkman ................ G03F 7/705 |

FOREIGN PATENT DOCUMENTS

| | | |
|---|---|---|
| WO | 2009078708 | 6/2009 |
| WO | 2009106279 | 9/2009 |
| WO | 2009148976 | 12/2009 |
| WO | 2013178422 | 12/2013 |
| WO | 2016202559 | 12/2016 |
| WO | 2018077651 | 5/2018 |

* cited by examiner

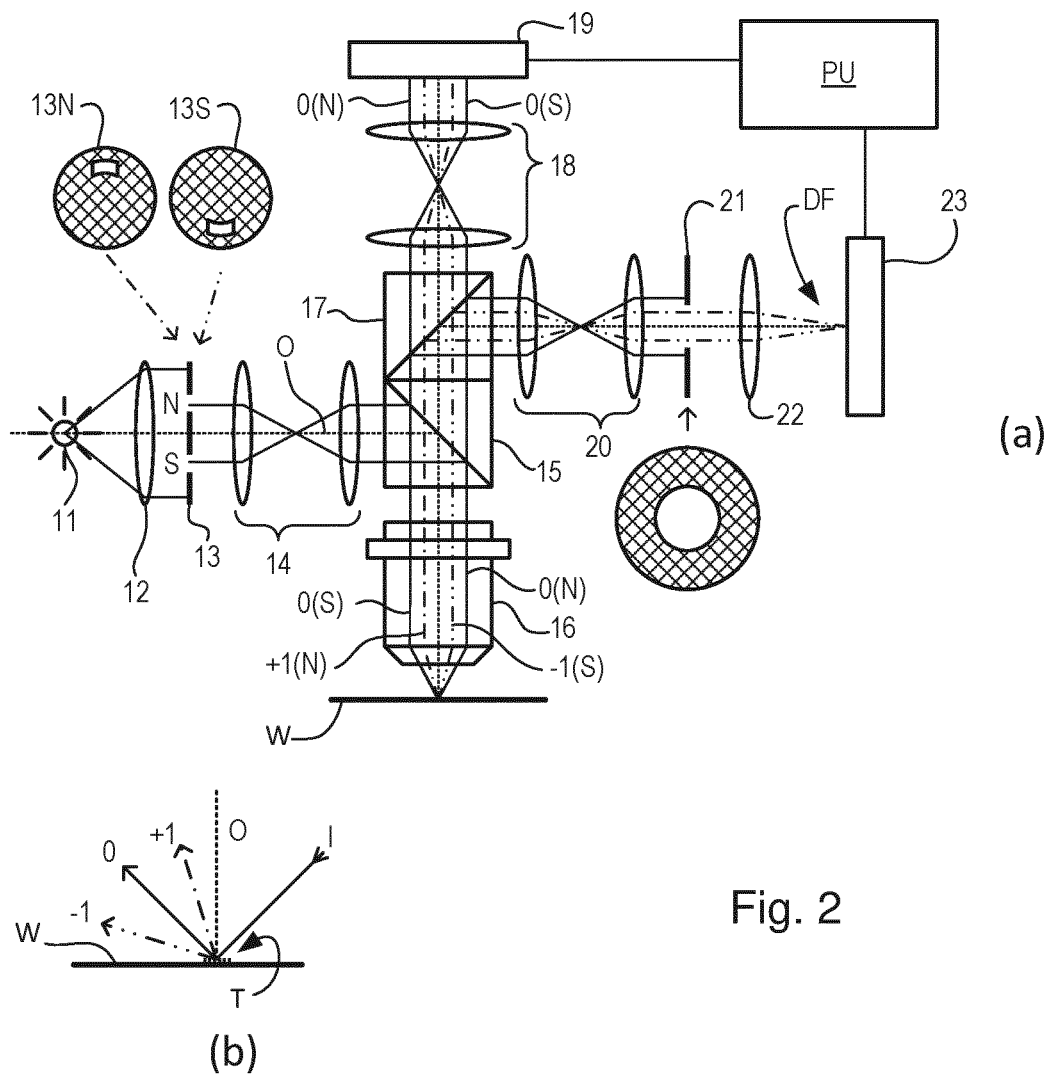
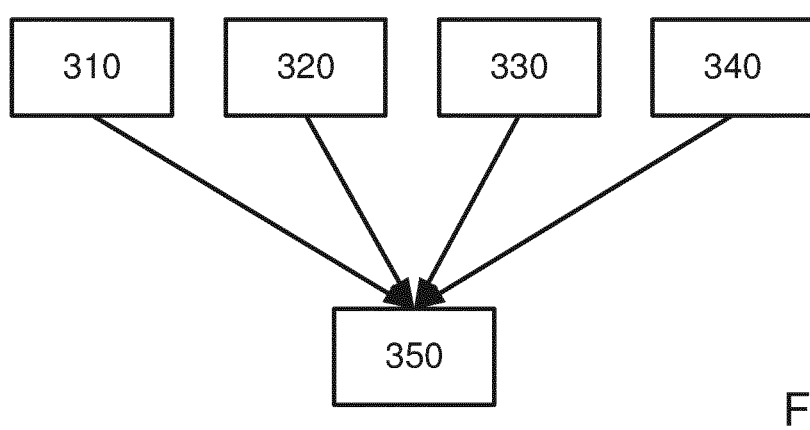
Fig. 2
Fig. 3

METHOD FOR CONTROLLING A MANUFACTURING PROCESS AND ASSOCIATED APPARATUSES

CROSS-REFERENCE TO RELATED APPLICATIONS

This application is the U.S. national phase entry of PCT Patent Application No. PCT/EP2021/050615 filed on Jan. 14, 2021, which claims priority of European Patent Application No. 20156961.3 which was filed on 12 Feb. 2020, European Patent Application No. 20158387.9 which was filed on 20 Feb. 2020, and European Patent Application No. 20177353.8 which was filed on 29 May 2020 which are incorporated herein in their entireties by reference.

FIELD OF INVENTION

The present invention relates to methods and apparatus for applying patterns to a substrate in a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In performing lithographic processes, such as application of a pattern on a substrate or measurement of such a pattern, process control methods are used to monitor and control the process. Such process control techniques are typically performed to obtain corrections for control of the lithographic process. It would be desirable to improve such process control methods.

SUMMARY OF THE INVENTION

In a first aspect of the invention, there is provided a method for controlling a process of manufacturing semiconductor devices on a substrate, the method comprising: obtaining process data relating to the process; determining a correction for the process based on the data and a first control objective associated with the devices on the substrate; determining a first probability of the first control objective being achievable; and adjusting the correction based on said probability and at least a second control objective having a second probability of being achievable compared to the first control objective.

In a second aspect of the invention, there is provided a lithographic apparatus which is configured to provide product structures to a substrate in a lithographic process, said lithographic apparatus comprising a processor operable to optimize control of the lithographic apparatus during the lithographic process by performing the method of the first aspect.

In a third aspect of the invention, there is provided a computer program comprising program instructions operable to perform the method of the first aspect when run on a suitable apparatus.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which:

FIG. 2 comprises a schematic diagram of a scatterometer for use in measuring targets according to embodiments of the invention;

FIG. 3 shows exemplary sources of processing parameters;

DETAILED DESCRIPTION

Before describing embodiments of the invention in detail, it is instructive to present an example environment in which embodiments of the present invention may be implemented.

Figure 1:
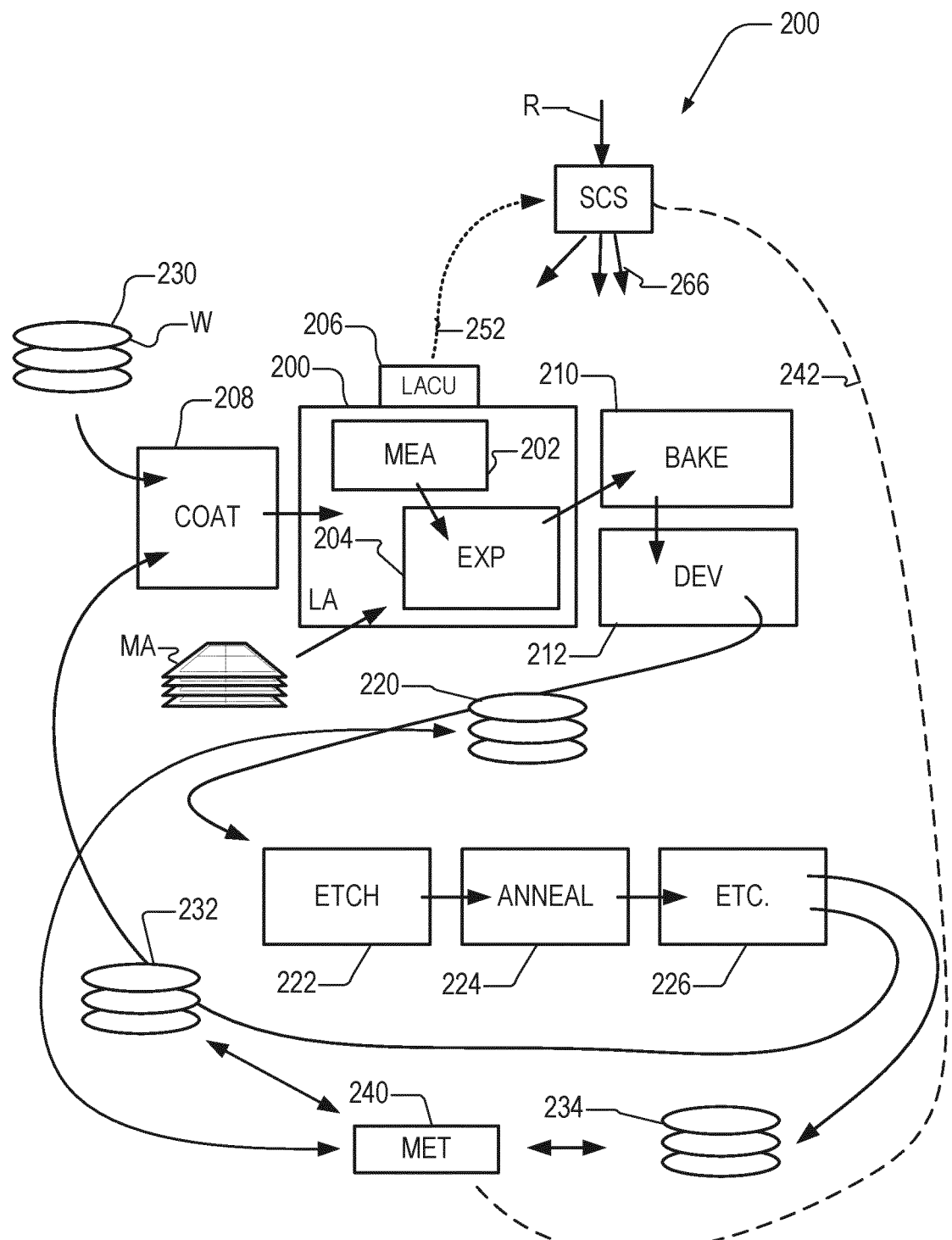
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

A metrology apparatus suitable for use in embodiments of the invention is shown in FIG. 2(a). A target T and diffracted rays of measurement radiation used to illuminate the target are illustrated in more detail in FIG. 2(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(a) and 2(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for many measurement purposes such as reconstruction used in methods described herein. The pupil plane image can also be used for focusing the metrology apparatus and/or normalizing intensity measurements of the first order beam.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 2 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 2) can be used in measurements, instead of or in addition to the first order beams.

The target T may comprise a number of gratings, which may have differently biased overlay offsets in order to facilitate measurement of overlay between the layers in which the different parts of the composite gratings are formed. The gratings may also differ in their orientation, so as to diffract incoming radiation in X and Y directions. In one example, a target may comprise two X-direction gratings with biased overlay offsets +d and −d, and Y-direction gratings with biased overlay offsets +d and −d. Separate images of these gratings can be identified in the image captured by sensor 23. Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process Various techniques may be used to improve the accuracy of reproduction of patterns onto a substrate. Accurate reproduction of patterns onto a substrate is not the only concern in the production of ICs. Another concern is the yield, which generally measures how many functional devices a device manufacturer or a device manufacturing process can produce per substrate. Various approaches can be employed to enhance the yield. One such approach attempts to make the production of devices (e.g., imaging a portion of a design layout onto a substrate using a lithographic apparatus such as a scanner) more tolerant to perturbations of at least one of the processing parameters during processing a substrate, e.g., during imaging of a portion of a design layout onto a substrate using a lithographic apparatus. The concept of overlapping process window (OPW) is a useful tool for this approach. The production of devices (e.g., ICs) may include other steps such as substrate measurements before, after or during imaging, loading or unloading of the substrate, loading or unloading of a patterning device, positioning of a die underneath the projection optics before exposure, stepping from one die to another, etc. Further, various patterns on a patterning device may have different process windows (i.e., a space of processing parameters under which a pattern will be produced within specification). Examples of pattern specifications that relate to a potential systematic defect include checks for necking, line pull back, line thinning, CD, edge placement, overlapping, resist top loss, resist undercut and/or bridging. The process window of all or some (usually patterns within a particular area) of the patterns on a patterning device may be obtained by merging (e.g., overlapping) process windows of each individual pattern. The process window of these patterns is thus called an overlapping process window. The boundary of the OPW may contain boundaries of process windows of some of the individual patterns. In another words, these individual patterns limit the OPW. These individual patterns can be referred to as "hot spots" or "process window limiting patterns (PWLPs)," which are used interchangeably herein. When controlling a lithography process, it is possible, and typically economical, to focus on the hot spots. When the hot spots are not defective, it is likely that all the patterns are not defective. The imaging becomes more tolerant to perturbations when values of the processing parameters are closer to the OPW if the values of the processing parameters are outside the OPW, or when the values of the processing parameters are farther away from the boundary of the OPW if the values of the processing parameters are inside the OPW.

FIG. 3 shows exemplary sources of processing parameters 350. One source may be data 310 of the processing apparatus, such as parameters of the source, projection optics, substrate stage, etc. of a lithography apparatus, of a track, etc. Another source may be data 320 from various substrate metrology tools, such as a substrate height map, a focus map, a critical dimension uniformity (CDU) map, etc. Data 320 may be obtained before the applicable substrate was subject to a step (e.g., development) that prevents reworking of the substrate. Another source may be data 330 from one or more patterning device metrology tools, patterning device CDU map, patterning device (e.g., mask) film stack parameter variation, etc. Yet another source may be data 340 from an operator of the processing apparatus.

Figure 4:
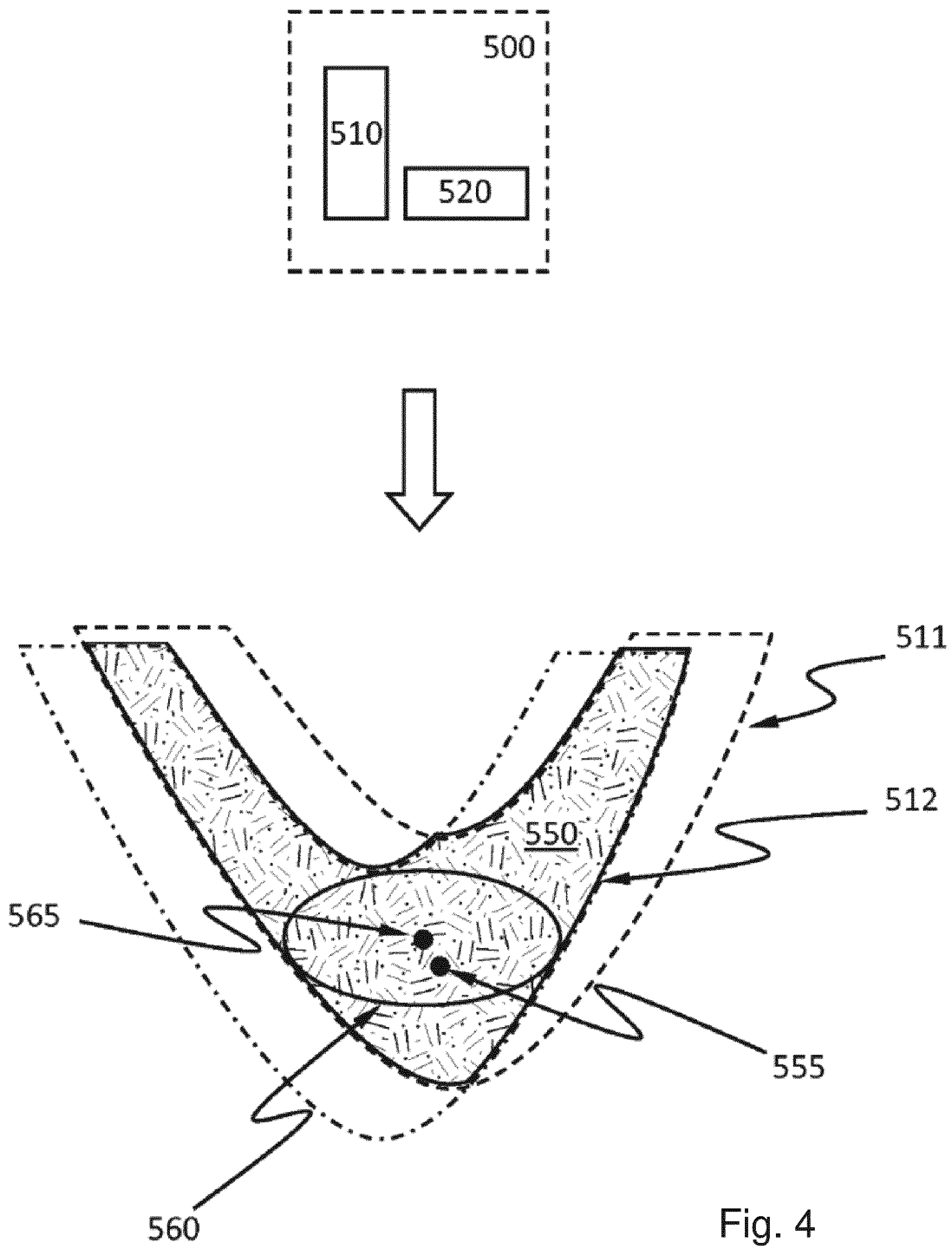
FIG. 4 schematically illustrates a concept of an overlapping process window (OPW)

FIG. 4 schematically illustrates the concept of an OPW. To illustrate the concept, an area, or grid element/pixel, 500 on the patterning device is assumed to have only two individual patterns 510 and 520. The area may include many more patterns. The process windows for the individual patterns 510 and 520 are 511 and 512, respectively. To illustrate the concept, the processing parameters are assumed to only include focus (horizontal axis) and dose (vertical axis). The processing parameters may however include any suitable parameters. The OPW 550 of the area can be obtained by finding the overlap between process windows 511 and 512. The OPW 550 is represented as the hatched area in FIG. 4. The OPW 550 can have an irregular shape. However, in order to easily represent the OPW and to easily determine whether a set of processing parameter values are within the OPW, a "fitted OPW" (e.g., ellipse 560) may be used instead. The "fitted OPW" can be, for example, the largest hyperellipsoid (e.g., ellipse in 2-dimensional processing parameter space as in this example, ellipsoid 3-dimensional processing parameter space, etc.) that fits inside the OPW. Using the "fitted OPW" tends to reduce the computational cost but does not take advantage of the full size of the OPW.

The values of the processing parameters may be selected such that they stay away from the boundary of the OPW or the fitted OPW, in order to decrease the chance that the processing parameters shift outside the OPW and thereby cause defects and decrease the yield. One approach of selecting the values of the processing parameters includes, before actual imaging, (1) optimizing the lithographic apparatus (e.g., optimizing the source and projection optics) and optimizing the design layout, (2) determining the OPW or fitted OPW (e.g., by simulation), and (3) determining a point in the space of the processing parameters (i.e., determining the values of the processing parameters) that is as far away as possible from the boundary of the OPW or fitted OPW (this point may be called the "center" of the OPW or fitted OPW). In the example of FIG. 4, point 555 is the point in the processing parameter space that is as far away as possible from the boundary of the OPW 550 and point 565 is the point in the processing parameter space that is as far away as possible from the boundary of the fitted OPW 560. Point 555 and point 565 may be referred to as the nominal condition. During or before imaging, if the processing parameters shift away from point 555 or point 565, towards the boundary of the OPW or even to the outside the boundary of the OPW, it would be beneficial to have the capability of realizing such a shift and to make appropriate corrections to put the processing parameters back into the OPW and away from its boundary, desirably without interrupting the imaging or other processing.

During or before the actual imaging, the processing parameters may have a perturbation that causes them to deviate from the point that is as far away as possible from the boundary of the OPW or fitted OPW. For example, the focus may change due to topography of a substrate to be exposed, drift in the substrate stage, deformation of the projection optics, etc.; the dose may change to due drift in the source intensity, dwell time, etc. The perturbation may be large enough to cause processing parameters to be outside the OPW, and thus may lead to defects. Various techniques may be used to identify a processing parameter that is perturbed and to correct that processing parameter. For example, if the focus is perturbed, e.g., because an area of the substrate that is slightly raised from the rest of the substrate is being exposed, the substrate stage may be moved or tilted to compensate for the perturbation.

Control of the lithographic process are typically based on measurements fed back or fed forward and then modelled using, for example interfield (across-substrate fingerprint) or intrafield (across-field fingerprint) models. Within a die, there may be separate functional areas such as memory areas, logic areas, contact areas etc. Each different functional area, or different functional area type may have a different process window, each with a different processes window center. For example, different functional area types may have different heights, and therefore different best focus settings. Also, different functional area types may have different structure complexities and therefore different focus tolerances (focus process windows) around each best focus. However, each of these different functional areas will typically be formed using the same focus (or dose or position etc.) setting due to control grid resolution limitations.

The lithographic control is typically performed using offline calculation of one or more set-point corrections for one or more particular control degrees of freedom, based on (for example) measurements of previously formed structures. The set-point corrections may comprise a correction for a particular process parameter, and may comprise the correction of a setting of a particular degree of freedom to compensate for any drift or error such that the measured process parameter remains within specification (e.g., within an allowed variation from a best setpoint or best value; for example, an OPW or process window). For example, an important process parameter is focus, and a focus error may manifest itself in a defective structure being formed on a substrate. In a typical focus control loop, a focus feedback methodology may be used. Such a methodology may comprise a metrology step which may measure the focus setting used on a formed structure; e.g., by using diffraction based focus (DBF) techniques in which a target with focus dependent asymmetry is formed such that the focus setting can be subsequently determined by measurement of the asymmetry on the target. The measured focus setting may then be used to determine, offline, a correction for the lithographic process; for example a positional correction for one or both of the reticle stage or substrate stage which corrects the focus offset (defocus). Such an offline positional correction may then be conveyed to the scanner as a set-point best focus correction, for direct actuation by the scanner. The measurements may be obtained over a number of lots, with an average (over the lots) best focus correction applied to each substrate of one or more subsequent lots. Control methods are described, for example, in EP3495888 which is incorporated herein by reference.

Figure 5:
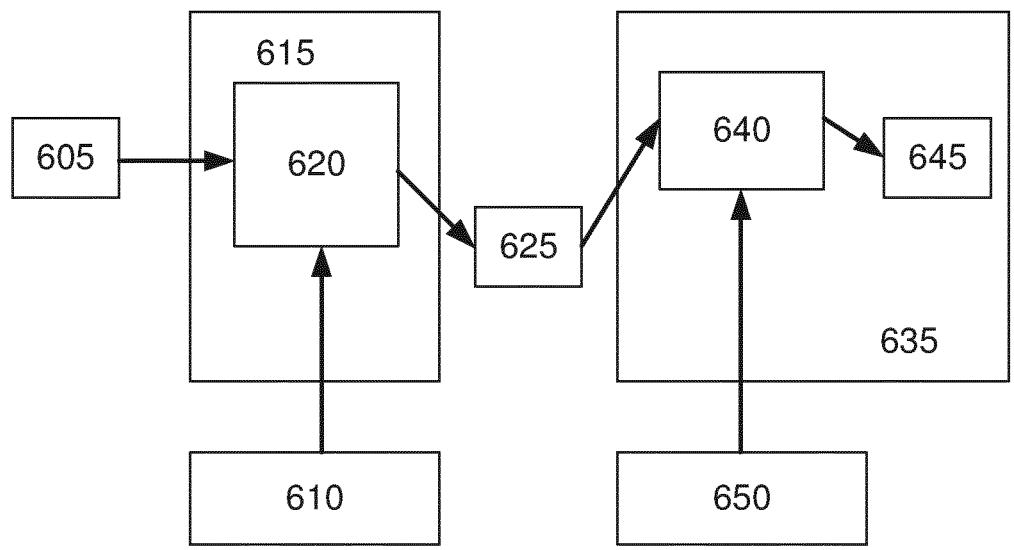
FIG. 5 illustrates schematically a method of determining corrections for control of a lithographic apparatus.

FIG. 5 illustrates such a methodology. It shows product information 605, such as product layout, illumination mode, product micro-topography etc., and metrology data 610 (e.g., defocus data or overlay data measured from previously produced substrates) being fed to an offline processing device 615 which performs an optimization algorithm 620. The output of the optimization algorithm 620 comprises one or more set-point corrections 625, e.g., for actuators which control reticle stage and/or substrate stage positioning within scanner 635. The set-point corrections 625 typically comprise simple correction offsets calculated to compensate for any offset errors (e.g., defocus, dose or overlay offset errors) comprised within the metrology data 610. The corrections for control reticle stage and/or substrate stage positioning may be, for example, control corrections in any direction, i.e., in the x, y and/or z directions, where x and y define the substrate plane and z is perpendicular to this plane. More specifically, they may comprise x/y direction corrections which correct for overlay/alignment errors, and/or z direction corrections which correct for focus errors. A control algorithm 640 (e.g., leveling algorithm) calculates control set-points 645 using substrate specific metrology data 650. For example, a leveling exposure trajectory (e.g., determining a relative movement or acceleration profile for positioning of the substrate stage relative to the reticle stage during the lithographic process) may be calculated using leveling data (e.g., a wafer height map) and outputs positional set-points 645 for the scanner actuators. The scanner 635 directly applies, equally for each substrate, the set-point corrections (offsets) 625 to the calculated set-points 645.

In other embodiments an optimization may be performed in real-time for such process parameters to determine corrections (e.g., corrected set-points), for example, on a per-substrate and/or per-layer basis. Therefore, instead of calculating a set-point correction offline based on (e.g., offline metrology) and feeding this set-point correction forward to the scanner, an optimization sub-recipe (e.g., a suitable optimization function) may be calculated based on the offline metrology, with the actual optimization performed and set-points calculated within the scanner (additional set-point corrections may optionally be calculated offline), using the results of any per substrate metrology.

A conventional optimization strategy may comprise a least-squares minimization or other minimization which applies an averaged optimization across the substrate based on a difference or residual from an actual value and a set-point value. Another strategy which may have advantages over a least-squares strategy may comprise a "dies-in-spec" optimization. This aims to maximize the number of dies that are within specification, rather than an overall or average residual across a substrate. As such, a "dies-in-spec" optimization uses prior knowledge of the product (the die layout) when optimizing the process parameter. A least squares optimization typically treats each location equally, without taking into account the die layout. Because of this, a least squares optimization may prefer a correction which "only" results in four locations being out-of-specification, but each in a different die, over a correction which has seven locations out-of-specification, but which only affect two dies (e.g., four defects in one die, three in another). However, as only a single defect will tend to render a die defective, maximizing the number of defect-free dies (i.e., dies-in-spec) is ultimately more important than simply minimizing the number of defects or average residual per substrate.

One type of dies-in-spec optimization which may comprise a maximum absolute (max abs) per die optimization. Such a max abs optimization may minimize the maximum deviation of the performance parameter from a control target. This should produce a solution, but does not prevent dies being out of spec (only attempts to minimize the number of dies-in-spec). As such, other strategies may be preferred, such as constraint limited strategies, where the objective (goal) is formulated in a way that comprises adding constraints to the optimization problem; e.g., such that one or more parameters or metrics are constrained within a range; i.e., they are not allowed to be out-of-spec.

However, there are other constraints such as the physical constraints of the system, such as field size and constraints in what can be varied per field, slit width and constraints in what can be varied per slit, actuation constraints in how stages can physically move etc. The result of this, is that for some constrained optimization problems, there is simply no solution; i.e., the optimization problem is infeasible such that no solutions satisfy all the constraints. In these cases the optimization solver simply cannot produce a result and send out a recipe to e.g., the scanner.

To address this, the proposed methods disclosed herein formulate control objectives and constraints as a hierarchy, such that the control action (e.g., a control correction or instruction for any aspect of the lithographic process) is always the best one possible, taking into account imposed limitations and the hierarchy of objectives.

It is proposed to utilize a hierarchical control framework wherein a hierarchy of control objectives provides guidance to the scanner control framework to control the process when a certain control objective cannot be met. Alternatively, or in addition, a flexible control framework can be provided to take many control considerations into account.

Such a method may comprise obtaining process data relating to the process (e.g., one or more of metrology data such as overlay data, critical dimension data, edge placement error data, alignment data, throughput data, focus data, dose data, leveling data CD data, CD uniformity data) and determining a correction for the process based on the data and a first control objective associated with the devices on the substrate. A first probability of the first control objective being achievable is determined and the correction adjusted based on said probability and at least a second control objective having a second probability of being achievable compared to the first control objective.

For example, if a main control objective, such as ensuring all critical features of all dies of an expose field are within spec, cannot be achieved, the proposed methods may determine which of a number of possible secondary control strategies should be followed. Similarly, even when the primary objective is feasible, the proposed method can advise on which one or more secondary options should also be followed and in which order, e.g., to improve quality and/or throughput.

For example, and more relevant to the situation where the primary objective is infeasible, the secondary objectives may be in the form of varying the constraints of the primary objective, e.g., to move one or more of the imposed bounds and widen the process window. Alternatively, a different constraint on a different parameter or metric (e.g., from edge placement error EPE to critical dimension uniformity CDU or overlay) may be imposed in place of the original constraint; or a combination of these approaches is possible, where the process window is widened but an additional constraint imposed. Other secondary objectives may comprise applying a different optimization problem e.g., going from max abs to least squares minimization (again this may be combined with any of the other proposals described above, or moving from a constrained die-in-spec where no dies are allowed to be out-of-spec, to a max abs dies-in-spec which maximizes the number of die-in-spec accepting that one or more may be lost. The may be multiple levels in the hierarchy, such as a tertiary level (e.g., further widening of process window) or a tertiary different control objective (e.g., maximize throughput) and so on.

Other secondary or non-primary objectives, more relevant when the primary objective and/or the objective ranked immediately above is feasible, may comprise aiming for further improvement (bringing one or more parameters closer to a set point or other best value e.g., by maximizing distance to process window boundary), imposing further constraints on other parameters or maximizing throughput for example.

The hierarchy may have an easier objective as a primary objective, and with successive ranks becoming harder to achieve; e.g., a primary objective of all dies yielding and a secondary objective of a challenging throughput constraint such as a minimum throughput. Alternatively this order may be reversed, or the hierarchy may not be ordered in terms of difficulty at all, but in terms of importance or another criterion.

By way of an example, a hierarchy may comprise at least two objectives of which one or more may comprise, in a purely exemplary order from most important to lesser importance:

1) Keep actuation setpoints within actuator constraints. The scanner actuators operate on an exposure field level where a single correction set is determined per exposure field. The exposure field may comprise multiple dies or a single die (or even a portion of a die with the die portions being subsequently "stitched" together). The corrections may be based on an evaluation of an estimated fingerprint, typically on a regular grid defining a "pixel" (e.g., each pixel being 1 nm×1 nm). Other actuator constraints may include, for example, the degrees of freedom a stage may move, allowed accelerations and forces, etc.
2) Ensure dies-in-spec for all features
3) Ensure dies-in-spec for all critical features (e.g., the aforementioned hot spots)
4) Maximize dies-in-spec for all features
5) Maximize dies-in-spec for all critical features
6) Optimize critical feature CDU
7) Optimize all feature CDU
8) Maximize distance from control limits (process window boundary); e.g., a process window optimization, which may comprise minimizing the maximum deviation of the performance parameter from a corresponding best parameter value and/or maximizing the distance of the performance parameter from edges of a corresponding allowed variation space. More specifically, a process window optimization may comprise maximizing over an optimization space, the minimum distance between a) a local excursion of said performance parameter with respect to a corresponding best parameter value (or other control target value) and b) a local edge of the corresponding allowed variation space.
9) Maximize throughput
10) Compensate optical process control residuals
11) Optimize MA vs. MSD balance; The MA/MSD weight ratio comprises the relative importance in the levelling algorithm given to a time Moving Average (MA) error and a time Moving Standard Deviation (MSD) of the error of a lithographic stage.

Note that these are examples in a non-exhaustive list, as is their order; the order may be dependent on the actual product and a desired throughput vs. quality balance, for example.

A number of specific examples will now be described. In such specific examples, a dies-in-spec optimization may comprise an iterative process whereby residuals of a first estimate m̂ (possibly comprising a least-squares fit) is calculated, and based on this the likelihood of a defect resulting from each residual. A maximum defect likelihood per die is calculated and the number of dies likely to have defects is determined. Then, over a number of iterations recommencing with the calculation of residuals, the relevant parameters are varied to minimize the number of dies likely to have defects. More specifically, the optimization may be based on a minimization of the sum of the estimated fingerprint (or other result depending on the parameter) m̂ to with the dot product of the appropriate design matrix C and a correction set p to be determined, although this is exemplary. More specifically, the primary optimization may be stated as:

$$\min_p \|\hat{m} + C \cdot p\|_2^2$$

subject to certain constraints including the actuator or scanner constraints and at least one bound (e.g., upper and lower bounds UB, LB) on m̂+C·p, thereby defining an allowed space, solution space or process window within the bounds for the correction set p, e.g.:

$$\min_p \|\hat{m} + C \cdot p\|_2^2 \text{ subject to: } \begin{cases} \hat{m} + C \cdot p \leq UB + \Delta \\ \hat{m} + C \cdot p \geq LB - \Delta \\ \text{scanner constraints} \end{cases} \quad \text{Eq (1)}$$

In this equation, a slack variable Δ is defined to implement the hierarchy; e.g., a primary objective has this set at zero. If this constraint renders the optimization unfeasible, then the slack variable may be implemented to widen the process window. Of course, this increases the risk of defect to a higher (and possibly very high) probability.

Such an approach can be performed on a per-field basis, e.g., the slack variable is increased uniformly for all pixels within the field (and therefore equal for all dies and features in the expose field). Or else it can be performed on a per-die basis, and in particular to relax the process window only for a die in a field considered to be least likely to yield in any case (e.g., effectively sacrificing that die). The die least likely to yield may be the one which is determined to have the greatest absolute violation of any bound associated to any pixel of that die. Such an approach may optionally use a "dead dies" database. Such a database may be maintained dynamically to record all instances where a die is believed to have, or is estimated will have, at least one defect (e.g., using previous yield data, data form other lithographic process and/or an estimation map/fingerprint).

In other embodiments, should the primary optimization be feasible (e.g., for $\Delta=0$), then a negative $\Delta$ may be applied at a next level, to implement a secondary constraint (e.g., bring the values closer to a set point/further away from process window boundary). This can be repeated for negative slack variables of increasing magnitude till the problem is unfeasible, with the last feasible solution chosen.

Figure 6:
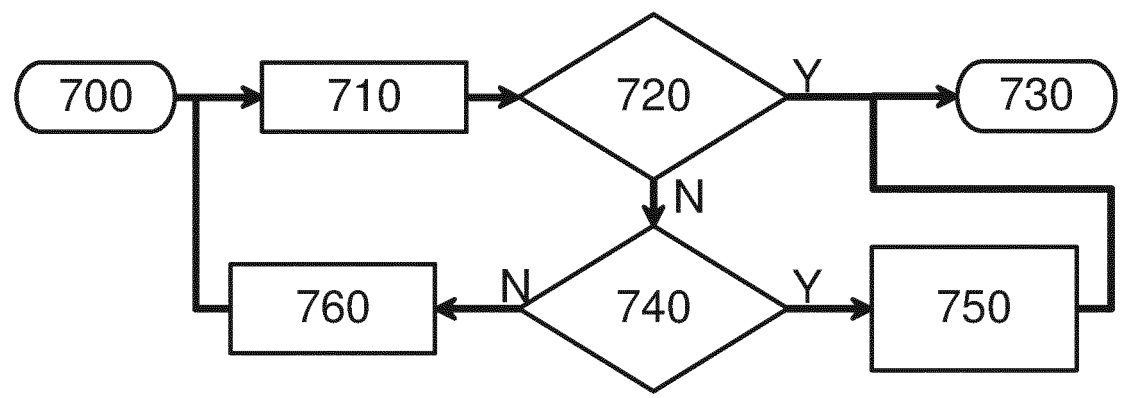
FIG. 6 is a flow diagram describing a method of determining a slack variable in accordance with an embodiment of the invention.

FIG. 6 is a flowchart describing a first implementation of the slack variable approach, where the slack variable is incremented iteratively. The flow begins at step 700, and at step 710, a solution for Equation (1) (e.g., for $\Delta=0$) is determined if possible. If a solution is found, at decision 720, the optimization is deemed feasible and the flow stops at 730, returning the solution; e.g., for forwarding to the scanner. If at decision 720, it is determined that the optimization is infeasible, a decision is made as to whether to stop 740 and proceed with only an optimization constrained with only the scanner constraints 750 (e.g., when a stopping criterion is reached such as exceeding a scanner constraint or throughput constraint). If the stopping criterion is not met at decision 740, the slack variable is updated 760 (e.g., by a small increment) and the loop defined by steps 710, 720, 760 are repeated till a feasible optimization is found and solution returned.

Figure 7:
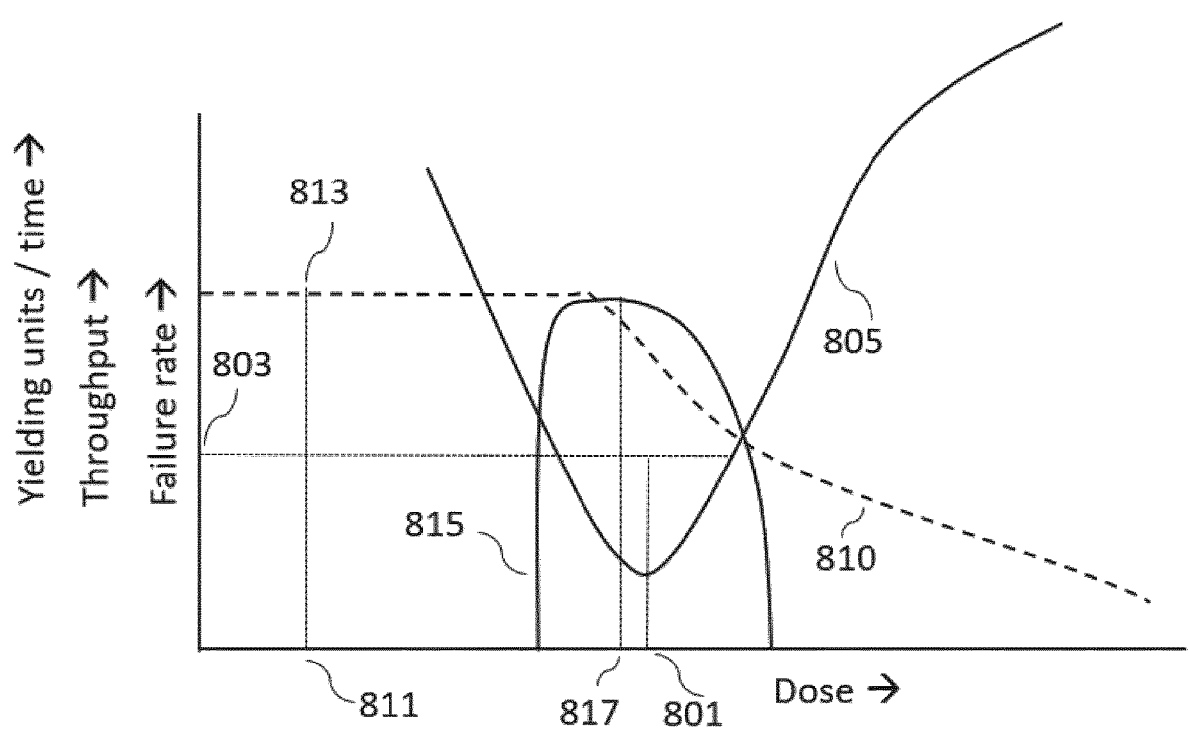
FIG. 7 depicts a relation between a yield parameter/throughput parameter and an exposure dose used in controlling a semiconductor manufacturing process according to an embodiment.

In a refinement of the procedure illustrated in FIG. 6, an initial step to determine (e.g., optimize) the slack variable may be performed, rather than the trial and error approach using the loop shown in FIG. 7. In this manner the main optimization needs only to be performed once, rather than for each iteration of the loop. This approach may be performed only after the primary objective has been deemed infeasible by initially performing the main optimization without the slack variable, or prior to any test of the primary objective. In the latter case, the slack variable optimization may return a slack variable of zero indicating that the primary objective is feasible.

The initial slack variable optimization may comprise a minimization of a suitable weighting w with the slack variable, subject to the same constraints as the main optimization (and that all values are positive). The weighting may represent the importance (e.g., ranking) of one entity over another entity; the entity may be a die, a feature or a pixel. For example, the weighting may weigh the slack so as to be only applied to a specific one or more dies, such as that determined to be the least likely to yield, in a non-primary objective. As such, an optimized slack variable $\Delta^*$ may be determined in the scanner optimization by:

$$\Delta^* = \underset{\Delta,p}{\operatorname{argmin}}(w^T \cdot \Delta) \text{ subject to:} \begin{cases} \hat{m} + C \cdot p \leq UB + \Delta \\ \hat{m} + C \cdot p \geq LB - \Delta \\ \Delta_i \geq 0, \forall i \\ \text{scanner constraints} \end{cases} \quad \text{Eq (2)}$$

The second optimization is the same as Equation (1) but using the slack variable defined in Equation (2); e.g.:

$$p^* = \underset{p}{\operatorname{argmin}} \|\hat{m} + C \cdot p\|_2^2 \text{ subject to:} \begin{cases} \hat{m} + C \cdot p \leq UB + \Delta^* \\ \hat{m} + C \cdot p \geq LB - \Delta^* \\ \text{scanner constraints} \end{cases} \quad \text{Eq (3)}$$

A more hierarchical optimization may comprise further dividing the slack optimization into a hierarchy of feasibility optimization problems, which respectively optimizes different elements of the slack variable (e.g., for different dies and/or pixels) in order of importance (ranking) e.g., the optimization problem of Equation (2) may be split into two or more ranks:

$$\underset{\Delta,p}{\min} \sum_{i \in rank1} \Delta_i \text{ subject to:} \begin{cases} \hat{m} + C \cdot p \leq UB + \Delta \\ \hat{m} + C \cdot p \geq LB - \Delta \\ \Delta_i \geq 0, \forall i \\ \text{scanner constraints} \end{cases} \quad \text{Rank 1}$$

$$\underset{\Delta,p}{\min} \sum_{i \in rank2} \Delta_i \text{ subject to:} \begin{cases} \hat{m} + C \cdot p \leq UB + \Delta \\ \hat{m} + C \cdot p \geq LB - \Delta \\ \Delta_i \geq 0, \forall i \\ \text{scanner constraints} \\ \text{all } \Delta \text{ of rank1 as determined} \\ \text{in rank 1 optimization} \end{cases} \quad \text{Rank 2}$$

$$\underset{\Delta,p}{\min} \sum_{i \in rankN} \Delta_i \text{ subject to:} \begin{cases} \hat{m} + C \cdot p \leq UB + \Delta \\ \hat{m} + C \cdot p \geq LB - \Delta \\ \Delta_i \geq 0, \forall i \\ \text{scanner constraints} \\ \text{all } \Delta \text{ for ranks 1 to } N-1 \text{ as} \\ \text{determined in prior optimizations} \end{cases} \quad \text{Rank N}$$

The different ranks can therefore relate to different dies, regions (groups of pixels), features and/or separate pixels. In this manner, greater importance can be placed to certain dies or regions (e.g., for critical features or important dies or regions of a die, with increasingly lesser importance placed on other regions corresponding to lower ranks in the hierarchy. More specifically, the slack variable for important regions can be fixed first (e.g., at a lower or zero value), with the other regions fixed thereafter according to ranking. Other variations may comprise constraining the most important regions, dies or features to have zero slack ($\Delta=0$ for a first ranking), with the slack variables in other regions determined according to the hierarchal methodology above (for one or more additional ranks).

In all the above, the optimization may be to optimize (e.g., corrections for) a particular process parameter; e.g., indicative of quality or speed. Such process parameters may include one or more of the following non-exhaustive list: overlay, CD, CDU, edge placement error, focus, dose, contrast MSDxyz from stage, throughput.

Within this disclosure, any mention of an allowed variation space or process window may comprise an overlapping process window as described and/or an N-dimensional dimensional process window (e.g., the axes may comprise one or more of focus, dose, overlay, contrast, etc.). In an embodiment, process window tracking may be employed. This comprises limiting locally one (or more) of the process window axes, thereby shifting the set point of another axis or axes. Process window tracking is described in WO2016202559, which is hereby incorporated by reference. In all cases the process window (or more generally the criticality metric) may be determined from product information or reticle design information (relating to the structures being exposed) and/or simulated design information to determine the process window information.

In another embodiment a first control objective is associated with a fraction of yielding product units (dies on a substrate, substrates, lots of substrates) and a second control objective is associated with a number of product units being processed per time unit. By configuring the control strategy corresponding to mentioned control objectives an optimal number of yielding product units per time unit is achieved. This control strategy is configured to improve creation of added value (per time unit) compared to state of the art control strategies focusing on either maximum yield or maximum throughput.

Typically one or more parameters of the process of interest drive said first and second control objectives. In case the process of interest is a lithographic process the process parameter may be a dose applied to the substrates during the exposures (of the photoresist on the substrates). There is normally a limited range of the dose value corresponding to a high number of yielding dies on a substrate. The dimensions of the features provided to the product units need to fulfill strict requirements in order for the ultimately manufactured semiconductor devices to have the desired electrical characteristics (resistance, capacitance for example). This is depicted in FIG. 7. The solid curve 805 represents the relation between a failure rate (Y-axis) of the product unit and the process parameter (dose, X-axis). The failure rate expresses an expected number of non-yielding product units scaled to a total number of manufactured product units. Hence the failure rate can be considered as a measure of the probability of complying to a certain yield criterion (e.g. minimum required fraction of yielding product units). It is preferred to operate in a process parameter regime associated with a low failure rate (e.g. complying with a high probability of yielding product units). Selection of one or more dose values 801 corresponding to an acceptable failure rate 803 corresponds to control based on the first control objective alone; maximizing a number of yielding product units. In an example the product units are dies and the first control objective corresponds to a number of yielding dies per substrate (wafer). In this example the failure rate expresses a probability of complying to the yield control objective and the solid line 705 expresses how this probability depends on the dose (process parameter).

The dashed curve 810 in FIG. 7 represents the relation between a throughput criterion (number of product units processed per time unit, Y-axis) and the process parameter (dose, X-axis). Typically a lithographic apparatus can increase the dose provided to the substrate up to a certain amount without scaling down its throughput. If a dose amount is requested which exceeds this amount it may be inevitable for the lithographic apparatus to reduce its throughput in order to allow the substrate to be exposed for a prolonged amount of time in order to receive the requested dose amount. This is depicted by the observed decline in the dashed curve 810 in case the dose exceed a certain threshold. Selection of one or more dose values 811 corresponding to a high throughput value 813 corresponds to control based on the second control objective alone; maximizing a number of processed product units per time unit. In this example the product units are dies and the second control objective corresponds to a number of processed (patterned) dies per hour.

In the same FIG. 7 the solid curve 815 represents the relation between a number of yielding product units processed per time unit based on an acceptable failure rate criterion (yielding dies per hour, Y-axis) and the process parameter (dose, X-axis). The curve 815 is derived from both the relation between the probability of yielding product units (failure rate) and the dose (curve 805) and the relation between the throughput and the dose (curve 810). Please note that the Y-axis units are different for the different curves 805, 810 and 815; only the dose axis is common to all curves. By depicting all three curves in one figure a better comparison between dose values selected based on each of the chosen control objectives can be made. Determining the dose value 817 corresponds to finding the maximum of the curve 815 associated with a maximum number of yielding product units (dies) per time unit. This determining of the dose 817 corresponds to a control strategy based on the first and the second control objective. The value of the dose 817 is basically obtained by modification of the dose 801 based on: 1) probability of the first objective (yield) being met across a range of dose values (e.g. modified dose needs to comply to acceptable failure rate), and 2) within the range of (acceptable) dose values the dose is modified such to correspond further to achieving the second control objective (throughput). The control strategy as implemented as such is then configured to provide a maximum number of yielding (e.g. not exceeding the acceptable failure rate) product units per time unit.

The proposed control strategy may be described by the following steps:

1) determining a correction to the process based on a first control objective, e.g. determining dose values 801 based on a yield criterion. The correction is typically based on process data conveying a quality of processing before the correction is applied, and an expected improvement of a metric (yield) associated with the first control objective achieved by applying the correction. In the example as given by FIG. 7 the process data may comprise measured Critical Dimensions (CD) data and dose data.

2) determining a probability of the first control objective being achievable, e.g. determining the failure rates for at least a subset of the dose values 801. This may be determined by inspection of product units produced for varying dose levels. By counting defect and functioning product units per dose level a failure rate curve, like the solid curve 805 can be derived.

3) adjusting the correction by using a dose 817 taking the failure rate (probability of meeting the first control objective) and a second control objective (number of process product units per time unit) into account. The adjusted correction (modified dose 817) is based on both the first and second control objectives, while taking the allowed range of modification into account (e.g. not surpassing a probability of not meeting the first control objective).

Additionally further control objectives may be taken into account as well, for example configured to penalize yield loss due to loss of material.

In an embodiment a method for controlling a process of manufacturing semiconductor devices is disclosed, the method comprising:

obtaining process data relating to the process;

determining a correction for the process based on the process data and a first control objective associated with a yield metric relating to a number of functioning devices;

determining a first probability of the first control objective being achievable; and adjusting the correction based on said first probability and at least a second control objective associated with a throughput metric relating to a number of devices produced per time unit.

In an embodiment the process data comprised yield data.

In an embodiment the process is a lithographic process.

In an embodiment the number of functioning device corresponds to a number of product units comprising exclusively functioning devices.

In an embodiment the product units may be one or more of: dies, substrates (wafers) or lots of wafers.

In an embodiment the first probability is associated with a failure rate of manufactured devices.

In an embodiment the correcting for the process is a dose correction corresponding to one or more values of a dose applied to a die, substrate or lot of substrates during performing the lithographic process.

In an embodiment the adjusting is further based on a third control objective associated with a cost of material loss due to the acceptance of non-functioning product units.

Further embodiments of the invention are disclosed in the list of numbered clauses below:

1. A method for controlling a process of manufacturing semiconductor devices on a substrate, the method comprising:
   obtaining process data relating to the process;
   determining a correction for the process based on the process data and a first control objective associated with the devices on the substrate;
   determining a first probability of the first control objective being achievable; and
   adjusting the correction based on said first probability and at least a second control objective having a second probability of being achievable compared to the first control objective.
2. The method according to clause 1, wherein the step of determining a first probability comprises determining whether the first control objective is feasible.
3. The method according to clause 1 or 2, wherein the first control objective is subject to one or more constraints.
4. The method according to clause 3, wherein the first control objective is related to maximizing the number of dies provided on the substrate which are estimated to be within a specification indicative that the die will be functional, subject to actuation constraints related to actuation of the correction.
5. The method according to clause 4, wherein the first control objective constrains the correction to one which ensures a high probability of all dies being functional.
6. The method according to clause 4 or 5, wherein said one or more constraints include an upper bound and lower bound on a performance parameter, said upper bound and lower bound defining an allowed variation space therebetween, a value for the performance parameter outside of which being indicative of a high probability of defect resulting in a non-functional die, and said second control objective relates to altering this constraint by moving one or both of said upper bound and lower bound.
7. The method according to clause 6, wherein the moving one or both of said upper bound and lower bound comprises moving one or both of said upper bound and lower bound away from a setpoint value to increase the allowed variation space and determining whether the altered constraint is achievable.
8. The method according to clause 7, wherein the method comprises repeating said steps of moving the upper bound and/or lower bound away from the setpoint value and determining whether the altered constraint is achievable till it is determined that the altered constraint is achievable.
9. The method according to clause 7, comprising an initial step of optimizing the amount to which the upper bound and/or lower bound is moved based on the same one or more constraints.
10. The method according to clause, 9, wherein said initial step comprises optimizing the amount to which the upper bound and/or lower bound is moved in accordance with a hierarchy, such that said amount is optimized separately for each rank in the hierarchy.
11. The method according to clause 10, wherein the hierarchy relates to different portions of a field and/or substrate.
12. The method according to clause 6, wherein, should the first probability of the first control objective being indicative that it is achievable, the at least a second control objective comprises moving one or both of said upper bound and lower bound towards a setpoint value to decrease the allowed variation space.
13. The method according to any preceding clause, wherein the at least a second control objective is applied only to a portion of a field and/or substrate.
14. The method according to clause 13, wherein said portion of a field and/or substrate relates to one or more dies estimated to be least likely to yield.
15. The method according to any of clauses 1 to 12, wherein the at least a second control objective is applied equally to a whole field and/or substrate.
16. The method according to any preceding clause, wherein the at least a second control objective relates to a different performance parameter than the first control objective.
17. The method according to any preceding clause, wherein the at least a second control objective relates to a different optimization strategy than the first control objective.
18. The method according to any preceding clause, wherein, should the first probability of the first control objective being indicative that it is achievable, the at least a second control objective adjusts the correction to further improve quality and/or increase speed of the process.
19. The method according to any preceding clause, wherein the at least a second control objective comprises minimizing the maximum deviation of the performance parameter from a corresponding control target value and/or maximizing the distance of the performance parameter from edges of a corresponding allowed variation space for the process parameter, the second control objective relates to altering this constraint to increase the allowed variation space by moving one or both of said upper bound and lower bound.
20. The method according to any preceding clause, wherein the at least a second control objective comprises maximizing throughput.
21. The method according to any preceding clause, wherein the at least a second control objective comprises multiple control objectives implemented according to a hierarchy.
22. The method according to any preceding clause, wherein said correction relates to control of one or more of a substrate stage, a reticle stage and a projection system of the lithographic apparatus.
23. The method according to any preceding clause, wherein said at least one performance parameter comprises one of: focus, dose, overlay, edge placement error, critical dimension, critical dimension uniformity and contrast Moving Standard Deviation of an error in a substrate stage and/or reticle stage.
24. A lithographic apparatus which is configured to provide product structures to a substrate in a lithographic process, said lithographic apparatus comprising a processor operable to optimize control of the lithographic apparatus during the lithographic process by performing the method of any preceding clause.
25. A lithographic apparatus according to clause 24, further comprising:
a substrate stage for holding the substrate;
a reticle stage for holding a patterning device; and
a projection system operable to project a radiation beam patterned by the patterned device onto the substrate.
26. A computer program comprising program instructions operable to perform the method of any of clauses 1 to 23, when run on a suitable apparatus.
27. A non-transient computer program carrier comprising the computer program of clause 26.
28. A method according to clause 1, wherein the first control objective is associated with a yield metric relating to a number of functioning devices and the second control objective is associated with a throughput metric relating to a number of devices produced per time unit.
29. The method of clause 28, wherein the process data comprised yield data.
30. The method of clause 28, wherein the process is a lithographic process.
31. The method of clause 28, wherein the number of functioning device corresponds to a number of product units comprising exclusively functioning devices.
32. The method of clause 31, wherein the product units may be one or more of: dies, substrates (wafers) or lots of wafers.
33. The method of any of clauses 28 to 32, wherein the first probability is associated with a failure rate of manufactured devices.
34. The method of any of clauses 28 to 33, wherein the correction is a dose correction corresponding to one or more values of a dose applied to a die, substrate or lot of substrates during performing the process.
35. The method of any of clauses 28 to 34, wherein the adjusting is further based on a third control objective associated with a cost of material loss due to the acceptance of non-functioning product units.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for controlling a process of manufacturing devices on a substrate, the method comprising:
obtaining process data relating to the process;
determining a correction for the process based on the process data and a first control objective associated with the devices;
determining a first probability of the first control objective being achievable; and
adjusting, by a hardware computer, the correction based on the first probability and at least a second control objective having a second probability of being achievable compared to the first control objective.

2. The method as claimed in claim 1, wherein the determining a first probability comprises determining whether the first control objective is feasible.

3. The method as claimed in claim 1, wherein the first control objective is subject to one or more constraints.

4. The method as claimed in claim 3, wherein the first control objective is related to maximizing the number of dies provided on the substrate which are estimated to be within a specification indicative that the die will be functional, and wherein the one or more constraints are associated with actuation constraints related to actuation of the correction.

5. The method as claimed in claim 4, wherein the first control objective constrains the correction to one which ensures a high probability of all dies being functional.

6. The method as claimed in claim 4, wherein the one or more constraints include a constraint comprising an upper bound and lower bound on a performance parameter, the upper bound and lower bound defining an allowed variation space therebetween, a value for the performance parameter outside of the allowed variation space being indicative of a high probability of resulting in a non-functional die, and the at least a second control objective relates to altering this constraint by moving one or both of the upper bound and lower bound.

7. The method as claimed in claim 6, wherein the moving one or both of the upper bound and lower bound comprises moving one or both of the upper bound and lower bound away from a setpoint value to increase the allowed variation space and determining whether the altered constraint is achievable.

8. The method as claimed in claim 6, wherein, should the first probability of the first control objective be indicative that the first control objective it is achievable, the at least a second control objective comprises moving one or both of the upper bound and lower bound towards a setpoint value to decrease the allowed variation space.

9. The method as claimed in claim 1, wherein the at least a second control objective relates to a different optimization strategy than the first control objective.

10. The method as claimed in claim 1, wherein, should the first probability of the first control objective be indicative that the first control objective it is achievable, the at least a second control objective adjusts the correction to further improve quality and/or increase throughput of the process.

11. The method as claimed in claim 1, wherein the first control objective is associated with a yield metric relating to a number of functioning devices and the at least a second control objective is associated with a throughput metric relating to a number of devices produced per time unit.

12. The method as claimed in claim 11, wherein the first probability is associated with a failure rate of manufactured devices and the correction is a dose correction corresponding to one or more values of a dose applied to a die, substrate or lot of substrates during performing the process.

13. A computer program product comprising a non-transitory computer-readable medium comprising instructions therein, the instructions configured to, when executed on a computer system, cause the computer system to at least:
   obtain process data relating to a process of manufacturing devices on a substrate:
   determine a correction for the process based on the process data and a first control objective associated with the devices;
   determine a first probability of the first control objective being achievable; and
   adjust the correction based on the first probability and at least a second control objective having a second probability of being achievable compared to the first control objective.

14. The computer program product as claimed in claim 13, wherein the first control objective is associated with a yield metric relating to a number of functioning devices and the at least a second control objective is associated with a throughput metric relating to a number of devices produced per time unit.

15. The computer program product as claimed in claim 13, wherein the first probability is associated with a failure rate of manufactured devices and the correction is a dose correction corresponding to one or more values of a dose applied to a die, substrate or lot of substrates during performing the process.

16. The computer program product as claimed in claim 13, wherein the instructions configured to cause the computer system to determine a first probability are further configured to cause the computer system to determine whether the first control objective is feasible.

17. The computer program product as claimed in claim 13, wherein the at least a second control objective relates to a different optimization strategy than the first control objective.

18. The computer program product as claimed in claim 13, wherein, should the first probability of the first control objective be indicative that the first control objective is achievable, the at least a second control objective adjusts the correction to further improve quality and/or increase throughput of the process.

19. The computer program product as claimed in claim 13, wherein the first control objective is subject to one or more constraints.

20. The computer program product as claimed in claim 19, wherein the first control objective is related to maximizing the number of dies provided on the substrate which are estimated to be within a specification indicative that the die will be functional, and wherein the one or more constraints are associated with actuation constraints related to actuation of the correction.

* * * * *